US008648327B2

(12) United States Patent
Herner

(10) Patent No.: US 8,648,327 B2
(45) Date of Patent: Feb. 11, 2014

(54) STACKABLE NON-VOLATILE RESISTIVE SWITCHING MEMORY DEVICES

(71) Applicant: Crossbar Inc., Santa Clara, CA (US)

(72) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/679,976

(22) Filed: Nov. 16, 2012

(65) Prior Publication Data
US 2013/0075689 A1 Mar. 28, 2013

Related U.S. Application Data

(62) Division of application No. 12/861,650, filed on Aug. 23, 2010, now Pat. No. 8,492,195.

(51) Int. Cl.
H01L 47/00 (2006.01)

(52) U.S. Cl.
USPC ....... 257/5; 257/2; 257/40; 365/148; 365/163

(58) Field of Classification Search
USPC .......... 257/2, 40; 438/102, 103; 365/148, 163
See application file for complete search history.

(56) References Cited

U.S. PATENT DOCUMENTS

| | | |
|---|---|---|
| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,128,214 A | 10/2000 | Kuekes et al. |
| 6,143,642 A | 11/2000 | Sur, Jr. et al. |

(Continued)

FOREIGN PATENT DOCUMENTS

KR 1020110014248 A 2/2011

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

(Continued)

Primary Examiner — Phuc Dang
(74) Attorney, Agent, or Firm — Ogawa P.C.

(57) ABSTRACT

A memory device includes a first plurality of memory cells arranged in a first crossbar array, a first thickness of dielectric material overlying the first plurality of memory cells, and a second plurality of memory cells arranged in a second crossbar array overlying the first thickness of dielectric material. The memory device further includes a second thickness of dielectric material overlying the second plurality of memory cells. In a specific embodiment, the memory device further includes a Nth thickness of dielectric material overlying an Nth plurality of memory cells, where N is an integer ranging from 3 to 8.

20 Claims, 13 Drawing Sheets

(56) References Cited

U.S. PATENT DOCUMENTS

| | | |
|---|---|---|
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,534,625 B2 | 5/2009 | Karpov et al. |
| 7,550,380 B2 | 6/2009 | Elkins et al. |
| 7,606,059 B2 | 10/2009 | Toda |
| 7,615,439 B1 | 11/2009 | Schricker et al. |
| 7,728,318 B2 | 6/2010 | Raghuram et al. |
| 7,729,158 B2 * | 6/2010 | Toda et al. .................. 365/148 |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,385,100 B2 | 2/2013 | Kau et al. |
| 2004/0026682 A1 | 2/2004 | Jiang |
| 2005/0020510 A1 | 1/2005 | Benedict |
| 2005/0029587 A1 | 2/2005 | Harshfield |
| 2005/0062045 A1 | 3/2005 | Bhattacharyya |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0087508 A1 | 4/2007 | Herner |
| 2007/0090425 A1 | 4/2007 | Kumar et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz De Araujo et al. |
| 2008/0106926 A1 | 5/2008 | Brubaker et al. |
| 2008/0185567 A1 | 8/2008 | Kumar et al. |
| 2008/0206931 A1 | 8/2008 | Breuil et al. |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0298224 A1 | 12/2009 | Lowrey |
| 2009/0321789 A1 | 12/2009 | Wang et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157710 A1 | 6/2010 | Lambertson et al. |
| 2010/0163828 A1 | 7/2010 | Tu |
| 2010/0176368 A1 * | 7/2010 | Ko et al. ........................ 257/5 |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0305064 A1 | 12/2011 | Jo et al. |
| 2011/0317470 A1 | 12/2011 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | DeLucca et al. |
| 2012/0043519 A1 | 2/2012 | Jo et al. |
| 2012/0043654 A1 | 2/2012 | Lu et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0235112 A1 | 9/2012 | Huo et al. |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.

(56) References Cited

OTHER PUBLICATIONS

Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60, 1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.

International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
*Ex parte Quayle* Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", 9$^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.

(56) References Cited

OTHER PUBLICATIONS

M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p$^+$a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feburary 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti—W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.
Office Action of U.S. Appl. No. 13/436,714 dated Aug. 27, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowability for U.S. Appl. No. 13/452,657, dated Oct. 10, 2013.

\* cited by examiner

STACKABLE NON-VOLATILE RESISTIVE SWITCHING MEMORY DEVICES

CROSS REFERENCE TO RELATED APPLICATIONS

The present application incorporates by reference and claims priority to the following pending patent application: U.S. patent application Ser. No. 12/861,650, filed Aug. 23, 2010.

JOINT RESEARCH AGREEMENT

The presently claimed invention was made by or on behalf of the below listed parties to a joint university-corporation research agreement. The joint research agreement was in effect on or before the date the claimed invention was made and the claimed invention was made as a result of activities undertaken within the scope of the joint research agreement. The parties to the joint research agreement are The University of Michigan and Crossbar, Incorporated.

BACKGROUND

The present invention is generally related to resistive switching devices. More particularly, embodiments according to the present invention provide a method and a structure for forming a stacked or vertically stacked resistive switching device. The present invention can be applied to non-volatile memory devices but it should be recognized that the present invention can have a much broader range of applicability The success of semiconductor devices has been mainly driven by an intensive transistor down-scaling process. However, as field effect transistors (FET) approach sizes less than 100 nm, problems such as the short channel effect degrade device performance. Moreover, such sub 100 nm device size can lead to sub-threshold slope non-scaling and also increases power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Switching for a PCRAM device requires large amounts of power. Organic RAM or ORAM is incompatible with large volume silicon-based fabrication and device reliability is usually poor.

From the above, a new semiconductor device structure and integration is desirable.

BRIEF SUMMARY OF THE PRESENT INVENTION

The present invention is generally related to resistive switching devices. More particularly, embodiments according to the present invention provide a method and a structure for forming a stacked or vertically stacked resistive switching device. The present invention can be applied to non-volatile memory devices but it should be recognized that the present invention can have a much broader range of applicability In a specific embodiment, a method of forming a vertically-stacked memory device is provided. The method includes providing a semiconductor substrate having a surface region. A first dielectric material is formed overlying the surface region of the semiconductor substrate. The method includes forming a first plurality of memory cells overlying the first dielectric material. In a specific embodiment, each of the first plurality of memory cells including at least a first top metal wiring structure spatially extending in a first direction, a first bottom wiring structure spatially extending in a second direction orthogonal to the first top metal wiring structure, a first switching element sandwiched between an intersection region of the first electrode structure and the second electrode structure. In a specific embodiment, the method includes forming a thickness of second dielectric material overlying the first plurality of memory cells including the top wiring structures. In a specific embodiment, the method forms a second plurality of memory cells overlying the second dielectric material, each of the second plurality of memory cells comprising at least a second top metal wiring structure extending in the first direction, and a second bottom wiring structure arranged spatially orthogonal to the second top metal wiring structure, and a second switching element sandwiched between the second top wiring structure and the second bottom wiring structure. More pluralities of memory cells may be formed above these two layers. As used herein, the term "vertical or vertically" is not in reference to gravity but in reference to a major plane of a substrate structure or the like.

In a specific embodiment, a memory device is provided. The memory device includes a first plurality of memory cells arranged in a first crossbar array. A first thickness of dielectric material overlies the first plurality of memory cells, and a second plurality of memory cells arranged in a second crossbar array overly the first thickness of dielectric material. In certain embodiment, the memory device can include three to eight layers of cell array. Each of the cell array is separated from a next using a thickness of dielectric material in a specific embodiment.

Many benefits can be achieved by ways of the present invention. For example, the present method forms a vertically stacked memory device to provide for a high density device structure using existing CMOS processing equipment and techniques. In certain embodiments, the present method provides arrays of interconnected memory cells with diode steering elements to decrease die size and enhance memory cell performance. Depending on the embodiment, one or more of these benefits may be achieved. One skilled in the art would recognize other variations, modifications, and alternatives.

DETAILED DESCRIPTION OF THE PRESENT INVENTION

The present invention is generally related to resistive switching devices. More particularly, embodiments according to the present invention provide a method and a structure for forming a vertically stacked resistive switching device. The present invention can be applied to non-volatile memory devices but it should be recognized that the present invention can have a much broader range of applicability The memory function of current non volatile memory devices are based on charges trapped in a dielectric material or a silicon floating gate. However, scaling of such charge-trap based materials is limited. For example, floating gate devices such as NOR or NAND devices have feature sizes of approximately 10 $F^2$ and 4.5 $F^2$, respectively, where F is the smallest feature size. Embodiments according to the present invention provide a method to form a non-volatile resistive switching device in layers which can be vertically stacked on top of one another to increase device density and to achieve an effective cell size of less than 4 $F^2$. Additionally, fabrication of the memory device is fully compatible with current CMOS processes.

Figure 1:
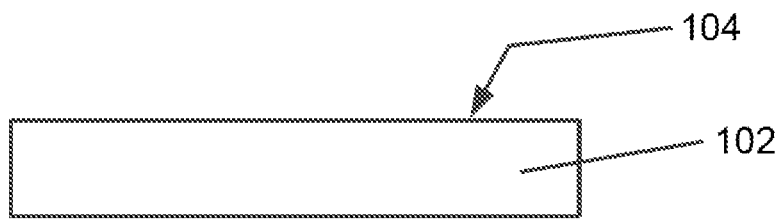
FIGS. 1-16 are simplified diagram illustrating a method of forming a resistive switching device according to an embodiment of the present invention
Figure 2:
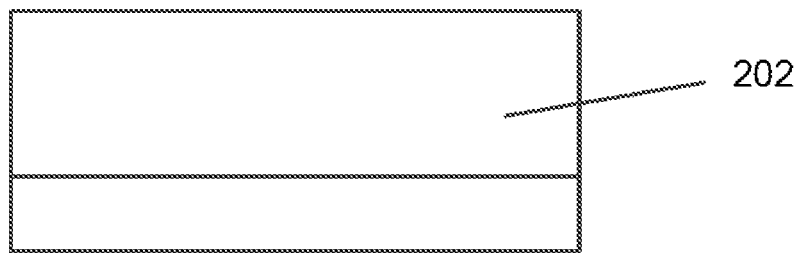

FIGS. 1-16 illustrate a method of fabricating a resistive switching device according to an embodiment of the present invention. The method includes providing a substrate 102 including a surface region 104. The substrate can be a semiconductor substrate such as a silicon wafer and the like. In certain embodiments, the substrate can include one or more devices formed thereon. The one or more devices can include transistor devices or others, depending on the embodiment. As shown in FIG. 2, the method includes forming a first dielectric material 202 overlying the surface region of the substrate. The first dielectric material can be a silicon oxide or a silicon nitride or a suitable dielectric film stack including a combination of different dielectric films. The first dielectric material can be formed using techniques such as chemical vapor deposition, spin on coating, including a combination of these techniques, and others.

Figure 3:
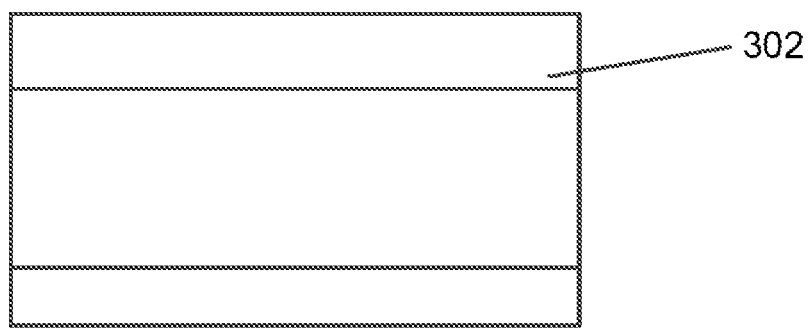
Figure 4:
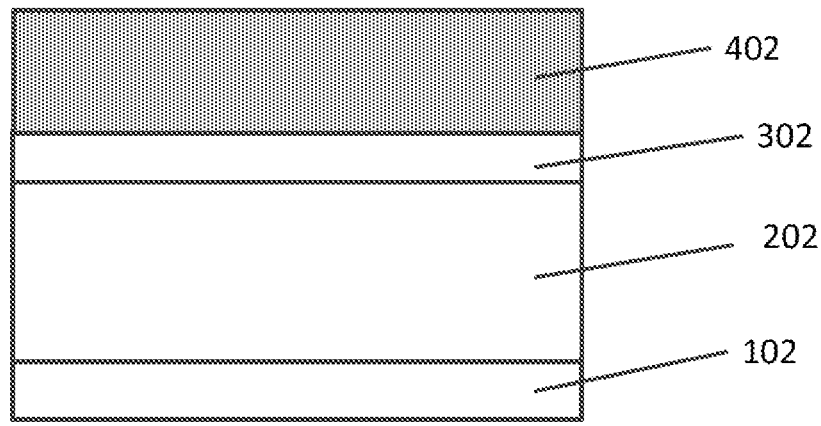

Referring to FIG. 3, the method deposits a first adhesion layer 302 overlying the first dielectric material. The first adhesion layer can be titanium, titanium nitride, tantalum, tantalum nitride, or tungsten nitride, or any combinations of these material, and others. The first adhesion layer may be formed using physical vapor deposition, chemical vapor deposition, or atomic layer deposition, and the like. In other applications, physical deposition such as sputtering may be used depending on the application. As shown in FIG. 4, a bottom wiring material 402 is formed overlying the first adhesion layer. The bottom wiring structure material can be aluminum, tungsten, copper, or other suitable metal materials depending on the embodiment. The bottom wiring material can be deposited using techniques such as physical vapor deposition, evaporation, chemical vapor deposition, electro-chemical methods such as electroplating or electrode-less deposition from a liquid medium, or other suitable deposition techniques including a combination. The first adhesion layer provides a glue layer for the first wiring material and the first dielectric material in a specific embodiment.

Figure 5:
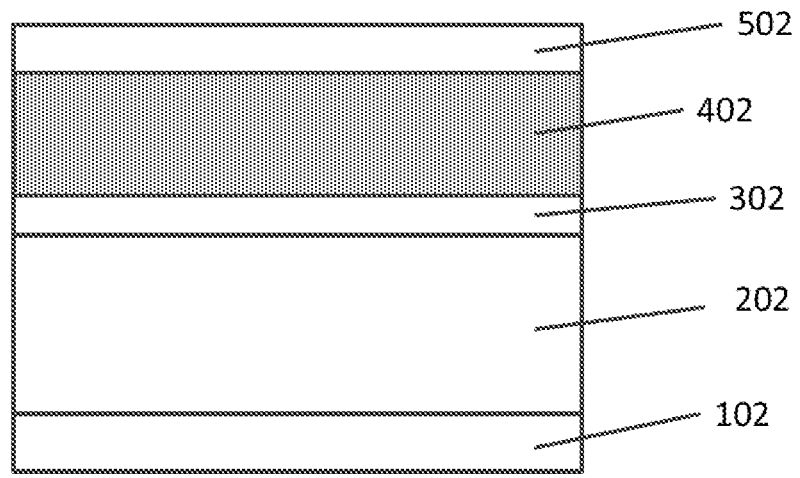

As shown in FIG. 5, the method of forming the switching device includes depositing a second adhesion layer 502 overlying the bottom wiring structure material. The second adhesion layer can also be a barrier layer or a blocking layer to prevent chemical reaction of the bottom wiring structure material with, for example, a switching layer material subsequently formed. The second adhesion layer can be titanium, titanium nitride, tantalum, tantalum nitride, tungsten, tungsten nitride, or others, depending on the embodiment.

Figure 6:
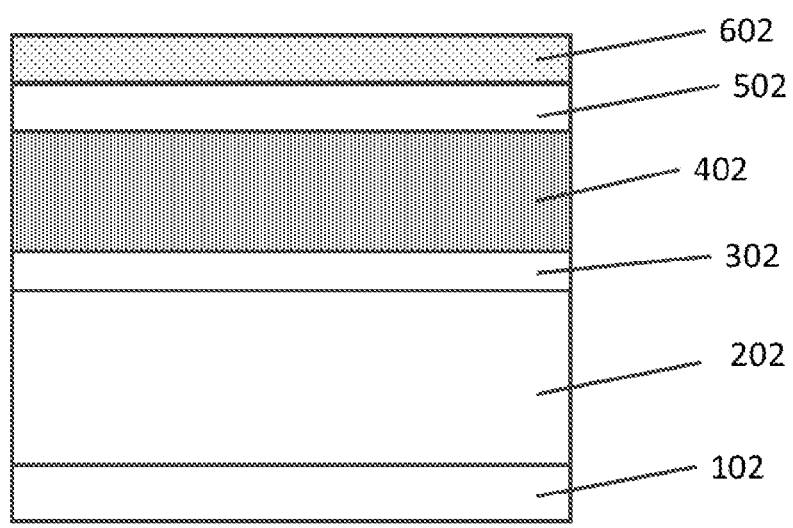

Referring to FIG. 6, the method includes forming a doped semiconductor material 802 overlying the second adhesion layer in a specific embodiment. The doped semiconductor material can be doped polycrystalline silicon, hereafter referred to as polysilicon material in a specific embodiment. The polysilicon material is used as a contact material between the bottom wiring material and an amorphous silicon switching material in a specific embodiment. In a preferred embodiment, the doped polysilicon material is $p^+$ doped, using impurity such as boron and the like. In a specific embodiment, the boron has a concentration ranging from about 1E18 to 1E21 $cm^{-3}$. The p+ polycrystalline silicon material can be deposited using a chemical deposition method or a physical deposition method depending on the embodiment. The chemical deposition method can include a chemical vapor deposition process using silane, disilane, a suitable chlorosilane, or any suitable silicon-containing gas as a precursor, and any suitable gas containing a p+ dopant for silicon, such as diborane, $B_2H_6$. In a specific embodiment, the p+ polycrystalline silicon material may be deposited using a plasma-assisted chemical deposition method. Deposition temperature for the p+ silicon material can range from about 200 Degree Celsius to about 500 Degree Celsius and preferably at about 400 Degree Celsius to about 450 Degree Celsius. In certain embodiments, the polysilicon material may be further processed to enhance the performance of the switching device. For example, defects or nano metal material may be formed in a surface region of the doped polysilicon material to enhance the performance of the switching device. In a specific embodiment, the polysilicon material allows for controlling and improving switching properties of the amorphous silicon switching material. For other switching materials, such as metal oxide, or others, other contact material may be used, or the contact layer may not be needed. Of course, one skilled in the art would recognize other variations, modifications, and alternatives.

Figure 7:
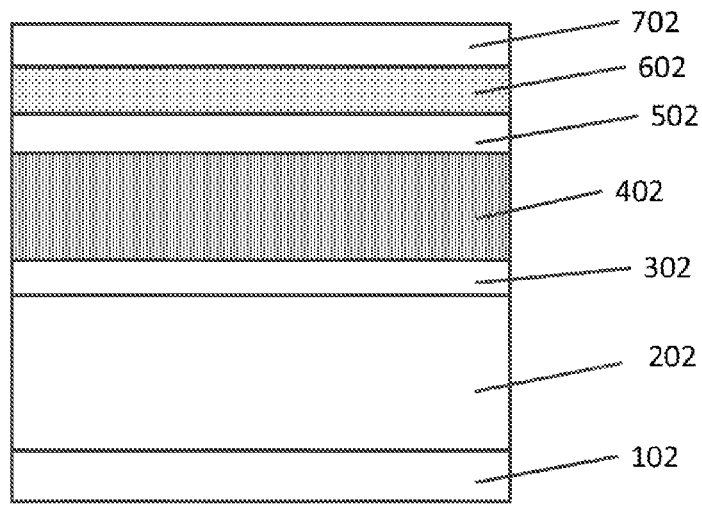

In a specific embodiment, the method forms a switching material 702 overlying the contact material as shown in FIG. 7. The switching material can be an undoped amorphous silicon material having an intrinsic semiconductor characteristic. The undoped amorphous silicon material can be deposited using a chemical deposition method or a physical deposition method depending on the embodiment. The chemical deposition method can include a chemical vapor deposition process using silane, disilane, a suitable chlorosilane, or any suitable silicon-containing gas as a precursor. In a specific embodiment, the undoped amorphous silicon material may be deposited using a plasma-assisted chemical deposition method. Deposition temperature for the amorphous silicon material can range from about 1500 Degree Celsius to about 450 Degree Celsius and preferably at about 350 Degree Celsius to about 400 Degree Celsius. Depending on the embodiment, the amorphous silicon material can be provided at a thickness ranging from about 50 Angstroms to about 1000 Angstroms. In a preferred embodiment, the amorphous silicon material is provided at a thickness ranging from about 200 Angstroms to about 700 Angstroms.

Figure 8:
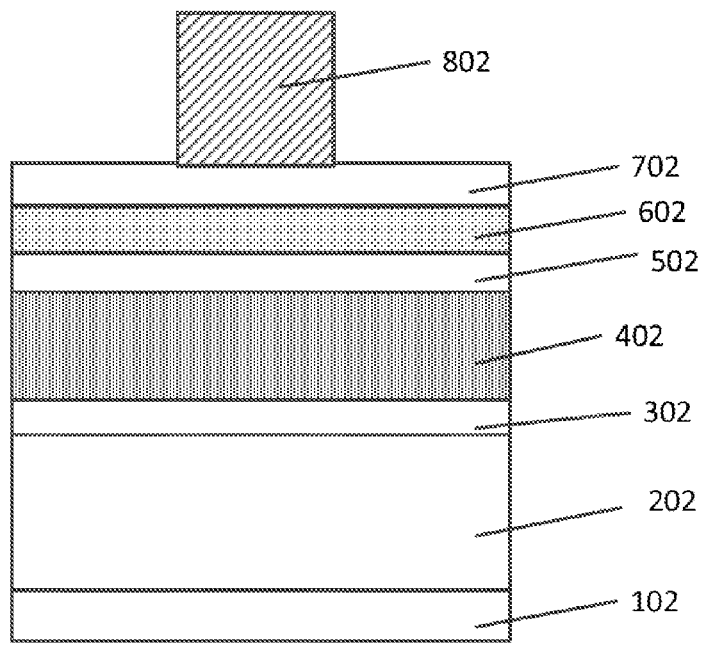

Referring to FIG. 8, the method includes forming a mask 802 overlying the switching material. The masking layer can be a suitable organic photoresist material, or an inorganic hard mask, or a combination of the two, depending on the embodiment. The hard mask can be formed from a dielectric material such as silicon oxide or silicon nitride, or others depending on the application. The hard mask may also be a metal or dielectric hard mask depending on the embodiment.

Figure 9:
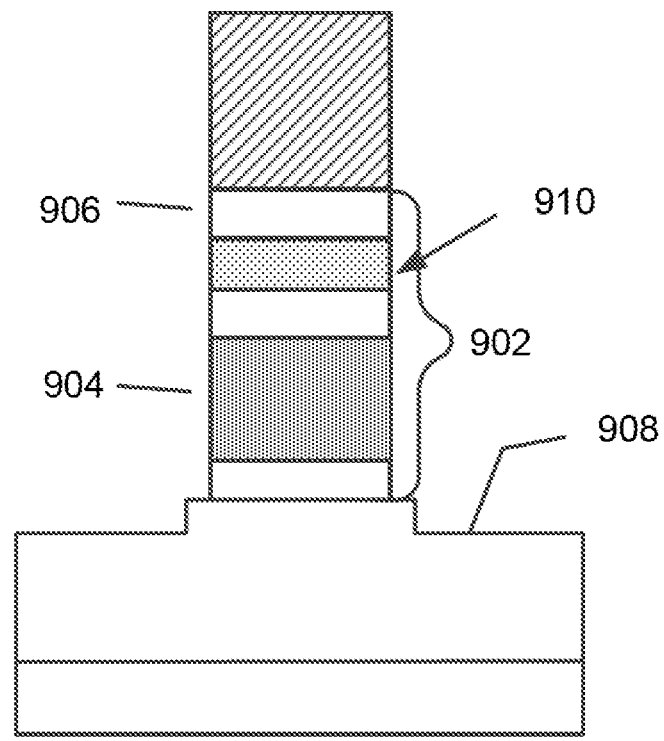

In a specific embodiment, the method subjects the switching material, the contact material, and the bottom wiring structure material to a first etching process using the masking layer as a mask to form a first structure 902 as shown in FIG. 9. The first etching process selectively removes a portion of the first dielectric material exposing a top surface region 908 of the first dielectric material. The first structure includes at least a bottom wiring structure 904, and a switching element 906 in a specific embodiment. The switching element includes at least a first side region 910. Depending on the hard mask used, any remaining portion of the hard mask after etching may be removed. Alternatively, the remaining hard mask after etch may be left intact if it is a dielectric.

Figure 10:
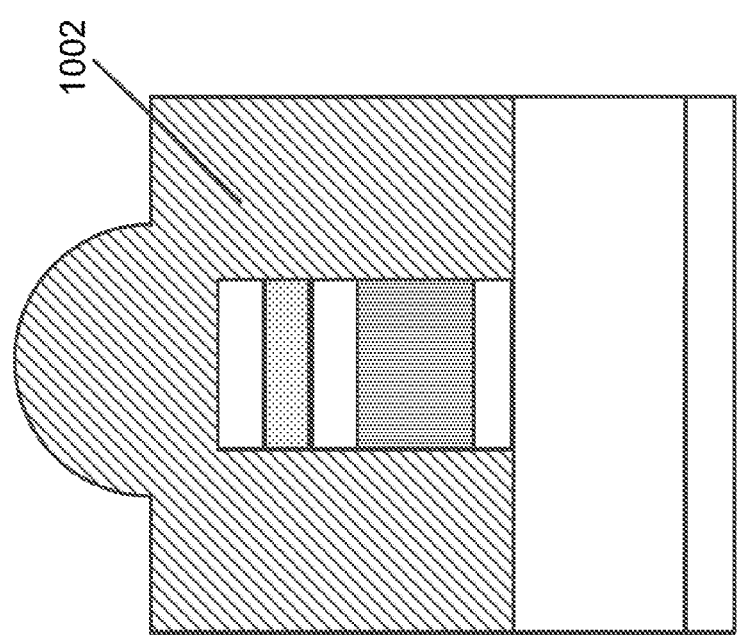

Referring to FIG. 10, the method includes depositing a second dielectric layer overlying the first structure and exposed portion of the first dielectric layer. The second dielectric layer can include a silicon oxide material or silicon nitride material or a combination depending on the embodiment, or any suitable dielectric material depending on the application. In a specific embodiment, the second dielectric layer can be silicon oxide deposited using a high density plasma enhanced chemical vapor deposition process, commonly known as HDP, using silane and oxygen as precursors. The silicon dioxide may also be deposited by a plasma enhanced deposition process (PECVD) using tetramethlyoxsilicate, commonly known as TEOS. The silicon oxide material may also be formed using a spin on coating technique followed by a suitable curing process. Or a combination of coating and chemical deposition may also be used depending on the application.

Figure 11:
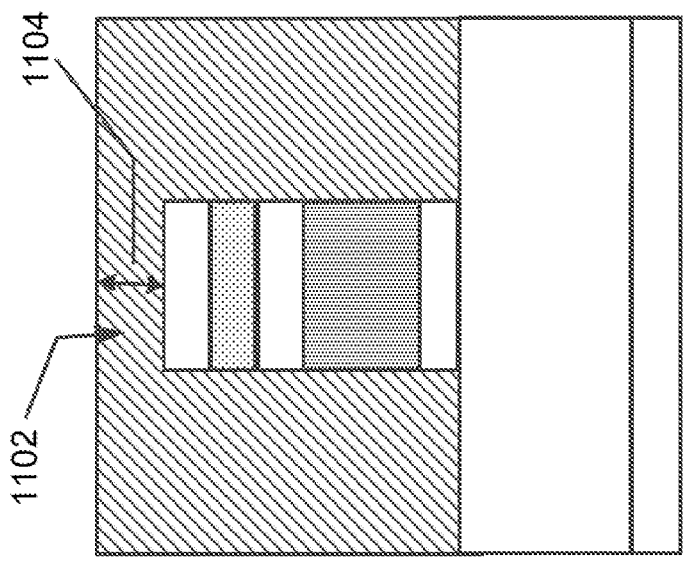
Figure 12:
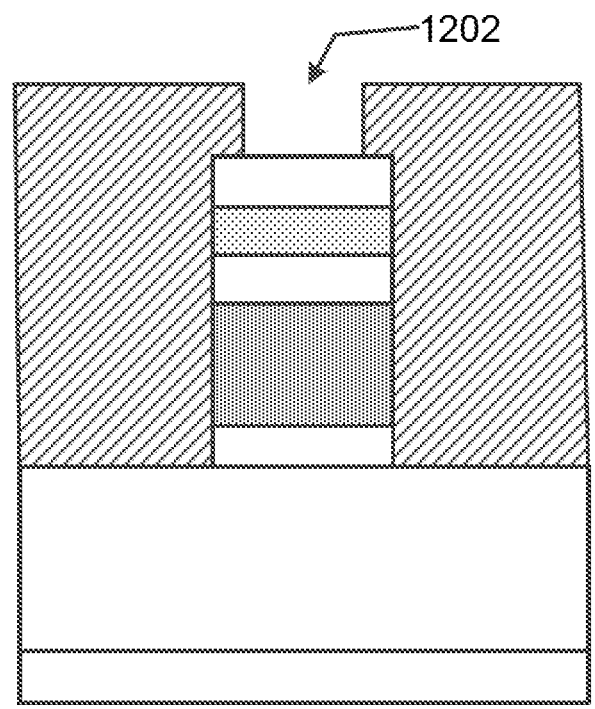

In a specific embodiment, the method employs a planarizing process to form a planarized dielectric surface 1102 as illustrated in FIG. 11. This may be accomplished by a chemical mechanical polishing process, or a non isotropic chemical etch, for example, a blanket etch of the second dielectric material in a specific embodiment. As shown, a portion 1104 of the second dielectric material is maintained overlying a top region of the switching element in a specific embodiment. In a specific embodiment, the method includes forming a first opening region 1202 in a portion of the second dielectric material to expose a portion of the top region of the switching element as shown in FIG. 12. The first opening region is formed by using a second patterning and etching process in a specific embodiment. The first opening region has a first dimension in a specific embodiment. For example for silicon dioxide as the dielectric material, the etching process may be a dry etch, such as a fluorine-based etching using $CF_4$, $SF_6$, or $NF_3$, as the etching gas. A suitable wet etching technique, such as a HF-based etching may also be used depending on the embodiment. Alternatively, laser ablation may be used to selectively remove the silicon oxide material overlying the switching material to form the first opening region.

Figure 13:
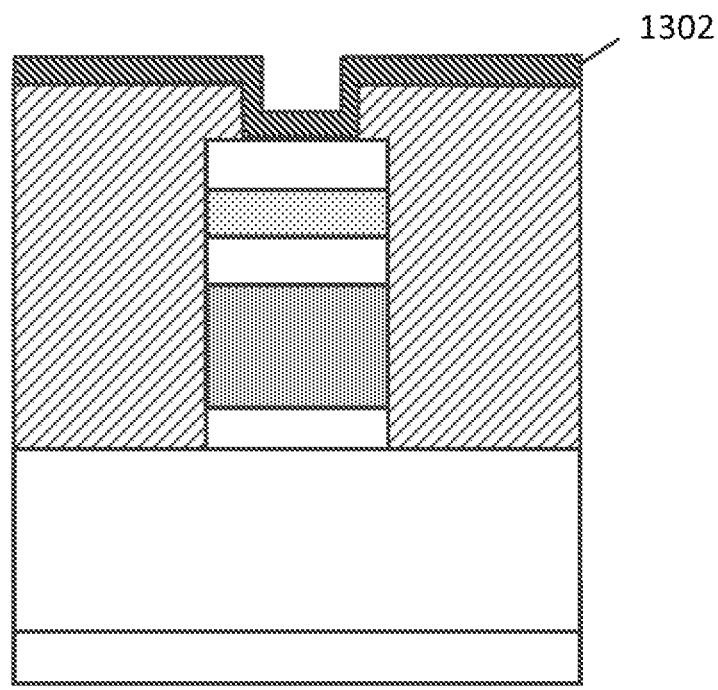

In a specific embodiment, the method includes forming a third dielectric material 1302 overlying the second dielectric layer including the first opening region as shown in FIG. 13. As shown, the third dielectric material is conformably formed overlying the second dielectric layer and the first opening region in a specific embodiment. The third dielectric material can be silicon nitride in a specific embodiment. Other suitable dielectric materials such as silicon oxide or a dielectric stack (for example, a silicon oxide on silicon nitride on silicon oxide stack, commonly known as ONO) may also be used depending on the embodiment.

Figure 14:
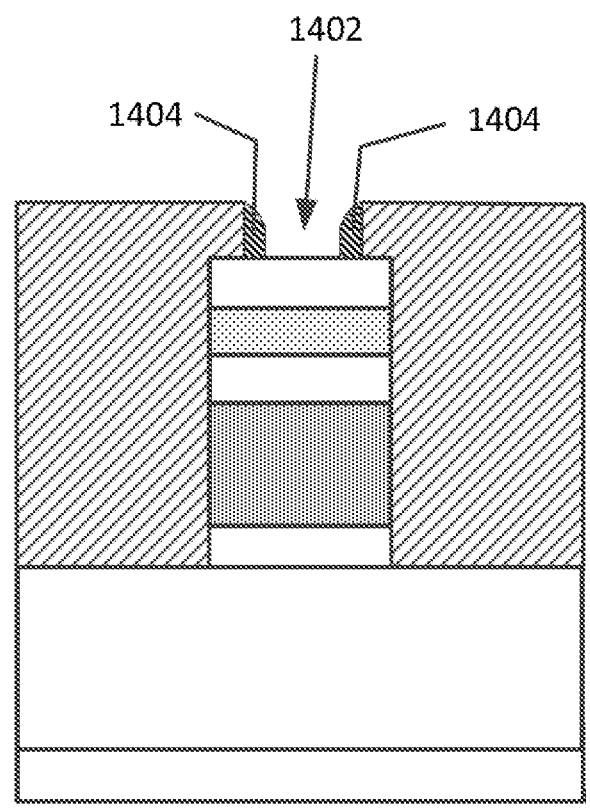

Referring to FIG. 14, the method subjects the third dielectric material to a nonconformal or an anisotropic etching process to remove a portion of the third dielectric material to form a second opening region 1402. As shown, the anisotropic etching process forms a side wall structure 1404 overlying the side region of the first opening region and a bottom region. The bottom region includes an exposed portion of the switching material in a specific embodiment. This etch is commonly used in semiconductor processing, and is known as a "sidewall spacer" etch. The exposed portion has a second dimension, which is less than the first dimension.

Figure 15:
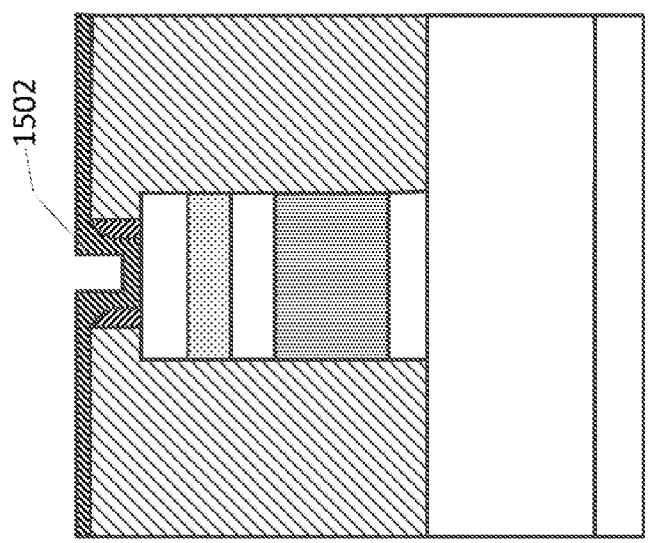

Referring to FIG. 15, the method forms a conductive material 1502 overlying at least the bottom region and the side wall structure. The conductive material can substantially fills the second opening region and in contact with the switching material in a specific embodiment. Alternatively, the conductive material can be conformably formed overlying the second opening region including the bottom region and the side wall structure depending on the deposition conditions. The conductive material is in contact with the switching element, as shown. In a specific embodiment, for an amorphous silicon switching material, the conductive material can be a silver material. The silver material can be deposited using a physical deposition process such as sputtering or evaporation. The silver material may also be formed using a chemical deposition process such as chemical vapor deposition, electrochemical such as electroplating or electroless plating, or a combination depending on the application.

Figure 16:
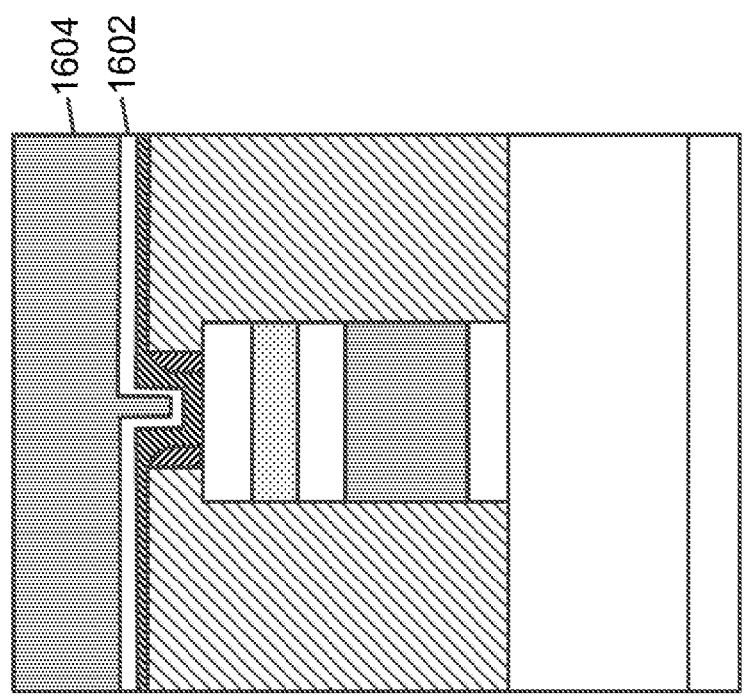

In a specific embodiment, the method includes forming a top barrier material 1602 overlying at least the conductive material and a top wiring material 1604 overlying the top barrier material as illustrated in FIG. 16 in a specific embodiment. The top barrier material can be a top adhesion material in a specific embodiment. The top barrier material can be titanium, titanium nitride, tantalum or tantalum nitride, tungsten, or tungsten nitride, or any suitable barrier material depending on the embodiment. Depending on the application, top barrier layer 1602 can be formed using a chemical deposition such as atomic layer deposition, chemical vapor deposition, and others, or a physical deposition such as sputtering, depending on the application. Top barrier material 1602 can protect the conductive material, for example, the silver material from oxidation in a specific embodiment. Top barrier material can also be a diffusion barrier between the conductive material and the top wiring material in a specific embodiment.

Again, depending on the embodiment, the top wiring material can be aluminum, tungsten, copper, or others. The top wiring structure material may be deposited using techniques such as physical vapor deposition process, for example, sputtering, evaporation, and others. The top wiring material may also be deposited using chemical deposition such as chemical vapor deposition, electrochemically including electroplating and electrodeless deposition depending on the embodiment.

In a specific embodiment, the method subjects a stack of material comprising the top wiring material, the top barrier material, and the contact material to a third pattern and etch process to from a top wiring structure. In a specific embodiment, the conductive material is in contact with the switching element. The top wiring structure is configured spatially at an angle to the bottom wiring structure to form a cross bar structure in a specific embodiment. In a specific embodiment, the top wiring structure is configured spatially orthogonal to the bottom wiring structure. The switching element is disposed in an intersection region of the top electrode structure and the bottom electrode structure. As merely an example, for a switching device using an amorphous silicon material as the switching material, the stack of material can comprise of aluminum, titanium nitride, and silver, while silver is in contact with the amorphous silicon material. Of course on skilled in the art would recognize other variations, modifications, and alternatives.

The above sequence of steps provides a method of forming a first array of memory cells for a vertically stacked device according to an embodiment of the present invention. The method forms a fourth dielectric material 1702 overlying the top wiring structure of first array of memory cells. The fourth dielectric material 1702 further fills in any gaps between the top interconnect wires. As shown, two memory cells are illustrated in the first array of memory cells. The first array of memory cells can have an X by Y array arranged in a crossbar configuration, where X and Y are integers and X>1, and Y>1. In a specific embodiment, fourth dielectric material 1702 can be silicon oxide, silicon nitride, or a dielectric stack with alternating dielectric materials, depending on the application. As shown, fourth dielectric material 1702 forms a thickness 1704 overlying the first array of memory cells. In a specific embodiment, the fourth dielectric material is subjected to a planarizing process to form a planarized surface region.

Figure 18:
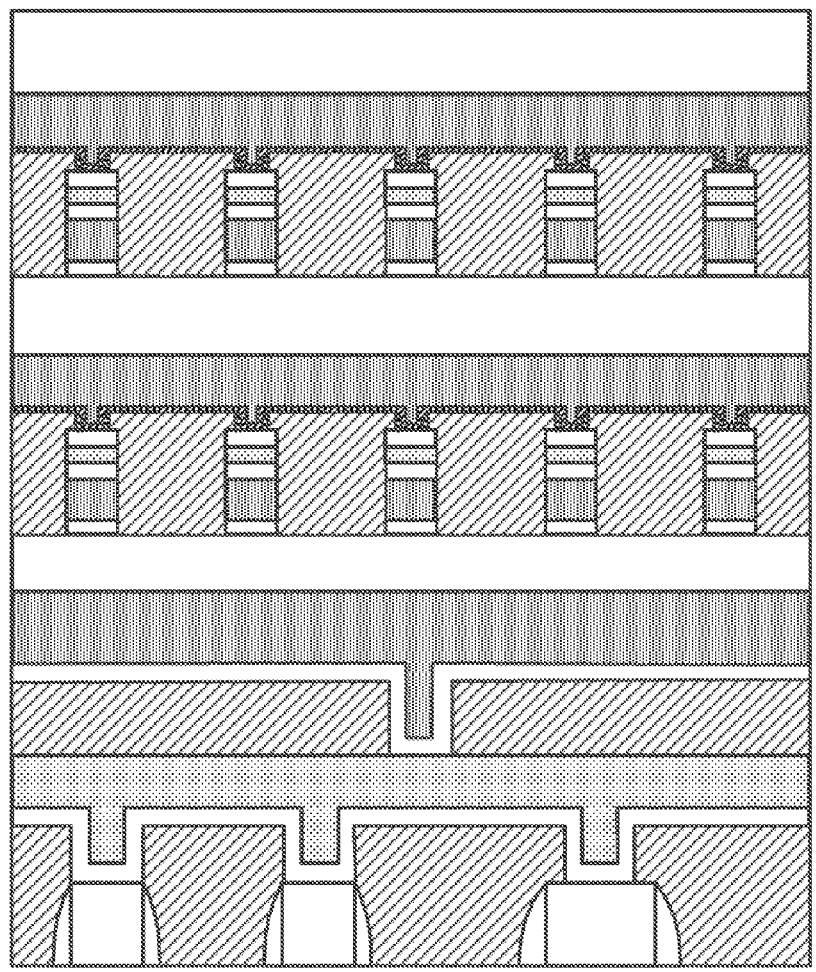

The method forms a second array of memory cells overlying the planarized fourth dielectric material as shown in FIG. 18. The second array of memory cells includes a plurality of memory cells. Each of the plurality of memory cells includes at least a second top electrode, a second bottom electrode, and a switching element sandwiched between the second top electrode and the second bottom electrode in a specific embodiment. The second top electrode extends in a direction parallel to the first top electrode in a specific embodiment. In a specific embodiment, the second bottom electrode and the second top electrode are spatially arranged at an angle, and preferably orthogonal to each other in a crossbar configuration. The method than repeats the above steps of forming a memory array and dielectric material stack to form a vertically stacked memory device. For example, a four layers of memory cell array result in an effective memory cell size of 1 $F^2$, where F is the feature size of a memory cell. In certain embodiment, each of the memory cells in an array can have an incipient diode to prevent program and read disturbs when selecting a device in an interconnecting array. In contrast to conventional configuration, the CMOS circuitry for programming the memory devices is beneath the layers of memory cell arrays. Therefore, the CMOS devices do not occupy additional area on the substrate. Vertical stacking as illustrated in FIG. 8 allows for a high density device and a small die size.

Figure 17:
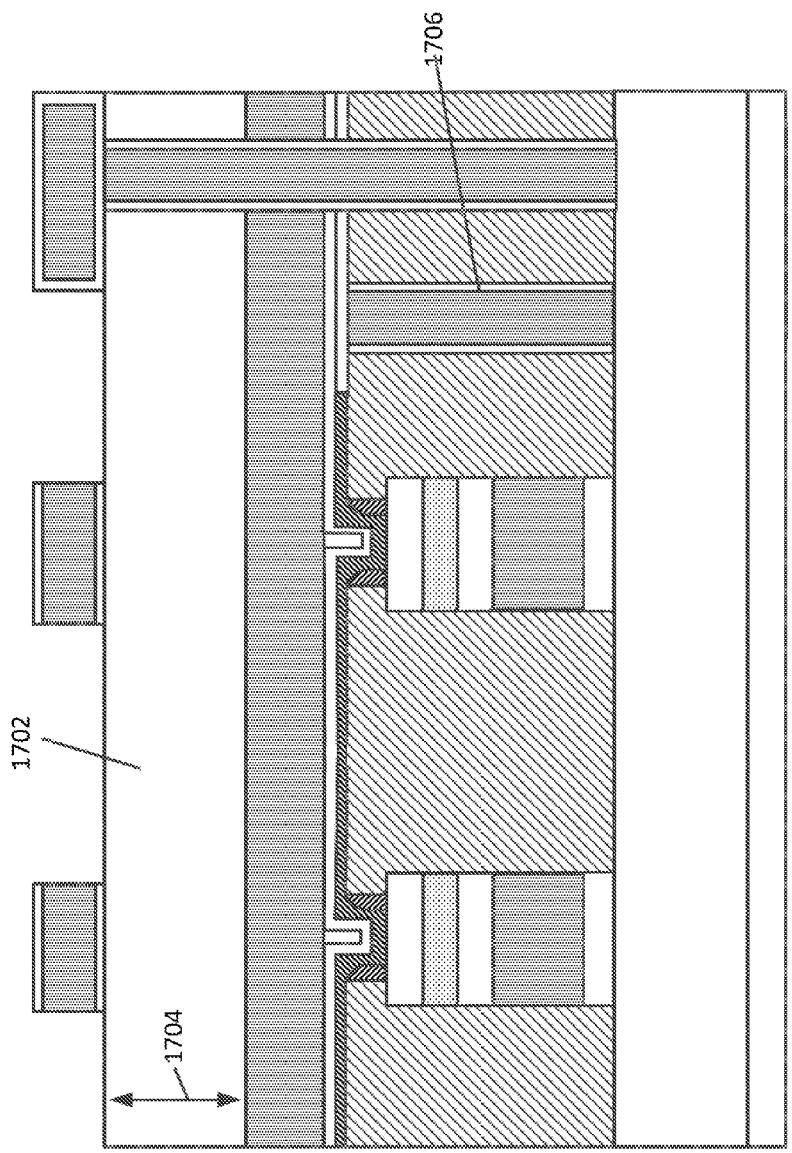
FIGS. 17-18 are simplified diagram illustrating a method of forming a vertically stacked memory device structure according to an embodiment of the present invention.

Referring again to FIG. 17. Depending on the embodiment, the method can form a plurality of via structures 1706 in a portion of the first dielectric material to connect the first array of memory cells with respective read, write, or erase circuitry provided by respective transistor devices on the semiconductor substrate. Via structure 1706 may connect the first top wiring structure or the first bottom wiring layer. In FIG. 17, the via structure connects to the first top wire layer. The via structure can be formed using a pattern and etch process to form an interconnect structure. In a specific embodiment, the method includes depositing an adhesion layer conformally formed overlying the via opening and an interconnect metal material overlying the adhesion layer to fill the plurality of via openings. The adhesion layer can be titanium, titanium nitride or tungsten nitride depending on the embodiment. The interconnect metal material can be tungsten, aluminum, copper or other suitable material. A metal planarizing process may be performed to remove the metal interconnect material from the dielectric surface in a specific embodiment. Alternatively, the via may be filled and metal deposited on top of the oxide 1704. This metal may be patterned and etched to form the bottom wire layer for the next layer of memory array. As shown, the via structure can be formed in an end region of each of the top wiring structure or the bottom wiring structure.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A memory device disposed upon a first dielectric material layer overlying a surface region of a semiconductor substrate, comprises:
    a first plurality of memory cells arranged in a first crossbar array overlying the first dielectric material, each of the first plurality of memory cells comprising at least a first metal wiring structure spatially extending in a first direction, a second metal wiring structure spatially extending in a second direction orthogonal to the first direction, and a first switching element sandwiched in an intersection region between the first metal wiring structure and the second metal wiring structure, the first plurality of memory cells forming the first crossbar array of memory cells;
    a second dielectric material overlying the first plurality of memory cells, the second dielectric material having a thickness; and
    a second plurality of memory cells arranged in a second crossbar array overlying the second dielectric material, each of the second plurality of memory cells comprising at least a third metal wiring structure extending in a third direction, a fourth metal wiring structure extending in a fourth direction orthogonal to the third direction, and a second switching element sandwiched in an intersection region of the third metal wiring structure and the fourth metal wiring structure, the second plurality of memory cells forming the second crossbar array of memory cells;
    wherein the first switching element comprises a switching material having intrinsic semiconductor properties;
    wherein the second switching element comprises a switching material having intrinsic semiconductor properties;
    wherein the first metal wiring structure further comprises a contact layer comprising a conductive silicon-containing material in contact with the switching material of the first switching element, and
    wherein the third metal wiring structure further comprises a contact layer comprising a conductive silicon-containing material in contact with the switching material of the second switching element.

2. The memory device of claim 1 wherein the first wiring structure and the third metal wiring structure are spatially arranged in a parallel manner.

3. The memory device of claim 1 further comprising an Nth dielectric material overlying an N–1th plurality of memory cells, where N is an integer ranging from 3 to 8.

4. The memory device of claim 1 further comprises:
    forming a third dielectric material overlying the second plurality of memory cells;
    forming a third plurality of memory cells overlying the third dielectric material;
    forming a fourth dielectric material overlying the third plurality of memory cells; and
    forming a fourth plurality of memory cells overlying the third dielectric material.

5. The memory device of claim 1 wherein the switching material comprises an undoped amorphous silicon material.

6. The memory device of claim 1 wherein the semiconductor substrate comprises one or more CMOS transistor devices formed thereon, the one or more transistor devices being operably coupled to the first plurality of memory cells and/or the second plurality of memory cells.

7. The memory device of claim 1 further comprises forming one or more via structures vertically coupling the first plurality of memory cells to transistor devices disposed within the semiconductor substrate.

8. The memory device of claim 1 wherein the second dielectric material is selected from a group consisting of: silicon oxide, silicon nitride, and oxide on nitride on oxide (ONO) stack.

9. The memory device of claim 1
wherein the second metal wiring structure includes a portion comprising a metal material coupled to switching material of the first switching element; and
wherein the metal material is selected from a group consisting of: silver, gold, platinum, palladium, aluminum, and nickel.

10. The memory device of claim 9 wherein the second metal wiring structure comprises one or more diffusion barrier material or adhesion layer.

11. The memory device of claim 9 wherein the one or more diffusion barrier material or adhesion layer is a material selected from a group consisting of: titanium, titanium nitride, tantalum or tantalum nitride, tungsten, and tungsten nitride.

12. The memory device of claim 1 wherein the conductive silicon-containing material comprises a p-doped poly silicon material.

13. The memory device of claim 9 wherein the metal material is silver, and uses p-doped poly silicon.

14. An electronic device, comprises
a semiconductor substrate comprising a surface region, wherein the semiconductor substrate includes a plurality of CMOS circuitry;
a first dielectric material overlying the surface region of the semiconductor substrate;
a first plurality of memory cells disposed within the first dielectric material, each of the first plurality of memory cells comprising at least a first metal wiring structure spatially extending in a first direction, a second metal wiring structure spatially extending in a second direction orthogonal to the first direction, and a first switching element sandwiched in an intersection region between the first metal wiring structure and the second metal wiring structure, the first plurality of memory cells forming a first crossbar array of memory cells;
a second dielectric material overlying the first plurality of memory cells; and
a second plurality of memory cells disposed within the second dielectric material, each of the second plurality of memory cells comprising at least a third metal wiring structure extending in a third direction, a fourth metal wiring structure extending in a fourth direction orthogonal to the third direction, and a second switching element sandwiched in an intersection region of the third metal wiring structure and the fourth metal wiring structure, the second plurality of memory cells forming a second crossbar array of memory cells, the second plurality of memory cells being isolated from the first plurality of memory cells by the second dielectric material;
wherein the second metal wiring structures comprises a contact layer comprising a conductive silicon containing material;
wherein the first plurality of memory cells comprises a silicon material having intrinsic semiconductor properties in contact with the conductive silicon containing material of the second metal wiring structure;
wherein the fourth metal wiring structures comprises a contact layer comprising a conductive silicon containing material;
wherein the second plurality of memory cells comprises a silicon material having intrinsic semiconductor properties in contact with the conductive silicon containing material of the fourth metal wiring structure; and
wherein the first plurality of memory cells are coupled to at least some of the CMOS circuitry.

15. The electronic device of claim 14 wherein the silicon material having intrinsic semiconductor properties comprises undoped amorphous silicon.

16. The electronic device of claim 15 wherein the undoped amorphous silicon material comprises a thickness within a range of about 200 Angstroms to about 700 Angstroms.

17. The electronic device of claim 14 wherein the conductive silicon containing material of the second metal wiring structure comprises a p-doped polysilicon.

18. The electronic device of claim 14 further comprises:
a third dielectric material overlying the second plurality of memory cells, the third dielectric material having a thickness; and
a third plurality of memory cells disposed within the third dielectric material, each of the third plurality of memory cells comprising at least a fifth metal wiring structure extending in a fifth direction, a sixth metal wiring structure extending in a sixth direction orthogonal to the fifth direction, and a third switching element sandwiched in an intersection region of the fifth metal wiring structure and the sixth metal wiring structure, the third plurality of memory cells forming a third crossbar array of memory cells, the third plurality of memory cells being isolated from the second plurality of memory cells by the third dielectric material;
wherein the sixth metal wiring structures comprises a contact layer comprising a conductive silicon containing material;
wherein the third plurality of memory cells comprises a silicon material having intrinsic semiconductor properties in contact with the conductive silicon containing material of the sixth metal wiring structure.

19. The electronic device of claim 14
wherein the first dielectric material comprises vias; and
wherein the first metal wiring structure is disposed overlying the first dielectric material and within the vias to contact the silicon material of the first plurality of memory cells.

20. The electronic device of claim 14 wherein the second plurality of memory cells are coupled to at least some of the CMOS circuitry.

* * * * *